(12) United States Patent
Yu et al.

(10) Patent No.: US 7,286,362 B2
(45) Date of Patent: Oct. 23, 2007

(54) HEAT DISSIPATING APPARATUS

(75) Inventors: Fang-Xiang Yu, Shen-Zhen (CN);
Yin-Jong Hsieh, Tu-Cheng (TW);
Shu-Ho Lin, Tu-Cheng (TW);
Da-Chang Chou, Tu-Cheng (TW)

(73) Assignees: Fu Zhun Precision Industry (Shenzhen) Co., Ltd., Bao'an District, Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 153 days.

(21) Appl. No.: 11/211,984

(22) Filed: Aug. 25, 2005

(65) Prior Publication Data
US 2006/0171125 A1 Aug. 3, 2006

(30) Foreign Application Priority Data
Jan. 28, 2005 (TW) .............................. 94201604 U (51) Int. Cl.
*H05K 7/20* (2006.01)

(52) U.S. Cl. ..................... 361/704; 361/709; 165/80.3; 174/16.3

(58) Field of Classification Search ................ 361/687, 361/690, 702–712, 714–719, 724, 756; 257/706–727; 165/80.2, 80.3, 80.4, 185, 121–127; 174/16.3; 411/511, 516, 530; 24/482, 485, 539, 531, 24/545–547, 555, 568, 630, 981, 625; 248/316.5, 248/505, 506, 510; 439/73, 485, 487
See application file for complete search history.

(56) References Cited

U.S. PATENT DOCUMENTS

| | | | |
|---|---|---|---|
| 6,449,154 B1 * | 9/2002 | Yoneyama et al. | 361/704 |
| 6,450,248 B1 | 9/2002 | Chang | |
| 6,662,412 B2 * | 12/2003 | Chuang et al. | 24/457 |
| 6,813,155 B2 * | 11/2004 | Lo | 361/709 |

* cited by examiner

*Primary Examiner*—Michael Datskovskiy
(74) *Attorney, Agent, or Firm*—Morris Manning Martin LLP; Tim Tingkang Xia, Esq.

(57) ABSTRACT

A heat dissipating apparatus includes a retention module (20) forming clipping portions (26) thereon, a heat sink (10) mounted to the retention module, and a clip (30) engaged with the retention module and the heat sink. The clip includes a resilient clipping member (32) clasped with the clipping portions, and an operating member (34) pivotally mounted to the clipping member. The operating member includes a longitudinal pole (340) rotating about an axis thereof. The longitudinal pole forms a supporting portion (341) to support the clipping member away from the retention module in the process of its rotation from unlock to lock position. At the lock position, the clipping member securely engages with the clipping portions of the retention module, and the heat sink is downwardly pressed by the longitudinal pole to have an intimate contact with a heat generating component (8).

15 Claims, 8 Drawing Sheets

HEAT DISSIPATING APPARATUS

TECHNICAL FIELD

The present invention relates to a heat dissipating apparatus, and particularly to a heat dissipating apparatus used in a computer for dissipating heat generated by electronic elements.

BACKGROUND

In nowadays, a heat sink is always used in a heat dissipating apparatus for dissipating heat generated by electronic elements. In order to make the heat sink have a good thermally contact with electronic elements, a clip is used for mounting the heat sink on electronic elements.

Referring to U.S. Pat. No. 6,450,248, a reference clip for a heat sink is shown. The clip includes a retention module attached to a PCB with electronic elements thereon, a frame engaged with the retention module to mounted the heat sink therebetween, and a controlling device pivotally connected to the frame. The controlling device is a U shaped one and has an elliptic boss formed at each distal end thereof. After the assembly of the clip and the heat sink, the controlling device is rotated to drive the elliptic boss move from a release position to a press position, to press the heat sink toward the electronic elements.

In this assembly, the U shaped controlling device locates on a top position of the heat sink. So it needs to provide a large area to adapt for the rotation of the controlling device. This violates the need of smaller volume of electric components. So a smaller heat dissipating apparatus is needed.

SUMMARY OF THE INVENTION

According to a preferred embodiment of the present invention, a heat dissipating apparatus includes a retention module forming clipping portions thereon, a heat sink mounted to the retention module, and a clip engaged with the retention module and the heat sink. A heat generating component to be cooled by the heat dissipating apparatus is located within the retention module. The clip includes a resilient clipping member clasped with the clipping portions, and an operating member pivotally mounted to the clipping member. The operating member includes a longitudinal pole rotating about an axial direction thereof. The longitudinal pole is located between the clipping member and the heat sink. The longitudinal pole forms a supporting portion having a rectangular cross section with rounded corners. A rotation of the operating member to a lock position causes the supporting portion to activate the clipping member to move away from the retention module, whereby the clipping member securely engages with the clipping portions of the retention module. Furthermore, at the lock position, the supporting portion activates the heat sink to move downwardly to have an intimate engagement with the heat generating component.

Other advantages and novel features of the present invention will become more apparent from the following detailed description of preferred embodiment when taken in conjunction with the accompanying drawings, in which:

DETAILED DESCRIPTION OF PREFERRED EMBODIMENT

Figure 1:
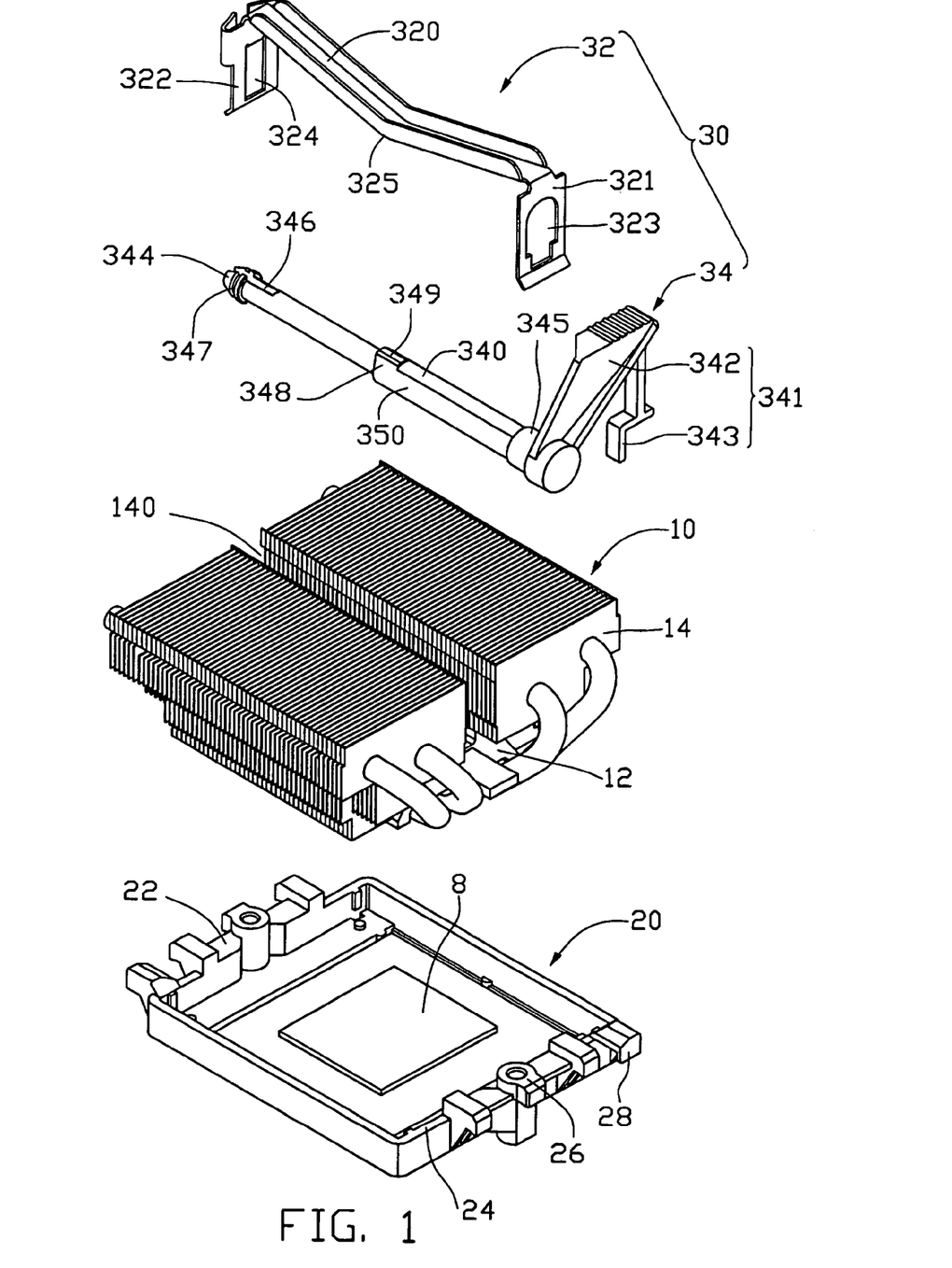
FIG. 1 is an exploded isometric view of a heat dissipating apparatus according to a preferred embodiment of the present invention.

According to FIG. 1, a heat dissipating apparatus for timely removing heat generated by a heat generating component 8 includes a heat sink 10, a retention module 20, and a clip 30 for engaging the heat sink 10 to the retention module 20. In this embodiment, the heat generating component 8 is a central processing unit (CPU) of mounted on a printed circuit board of a computer (not shown). The retention module 20 is also mounted on the printed circuit board, and the heat generating component 8 is located within the retention module 20.

The heat sink 10 includes a base 12 thermally contacted with the heat generating component 8, and two groups of fins 14 mounted on the base 12. The heat sink 10 forms a channel 140 at a middle portion thereof between the two groups of fins 14. The channel 140 is used to receive the clip 30 therein.

The retention module 20 is rectangular shaped, and includes two clipping portions 26 at middles of two opposite sides 22, 24 thereof, respectively, and a blocking portion 28 at an end of the side 24. The clipping portions 26 extend outwardly along opposite directions beyond the two opposite sides 22, 24, respectively. The blocking portion 28 extends outwardly beyond the side 24 in a direction the same as the clipping portion 26.

The clip 30 includes a resilient clipping member 32, and an operating member 34 for cooperating with the resilient clipping member 32 to conveniently lock/unlock the heat sink 10 to/from the retention module 20.

The clipping member 32 includes a main body 320, and two clasping plates 321, 322 extending downwardly from two distal ends of the main body 320. The clasping plates 321, 322 define two clasping holes 323, 324 therein respectively. The main body 320 is bent downwardly at a middle portion thereof, to form a middle pressing surface 325. Two sides of the main body 320 extend slantingly and upwardly from the pressing surface 325 of the main body 320.

The operating member 34 includes a longitudinal pole 340 and an operating portion 341 integrally formed with the pole 340. The operating portion 341 extends perpendicularly from an end of the pole 340. When the operating portion 341 is depressed, the pole 340 rotates accordingly. The operating portion 341 includes a driving end 342, and a pressing end 343 extending downwardly from the driving end 342 for engaging with the blocking portion 28 when the clip 30 is operated to lock the heat sink 10 to the retention module 20.

The pole 340 includes an expanding portion 344 at one end away from the operating portion 341, and a column portion 345 at the other end adjacent to the operating portion 341. The expanding portion 344 and the column portion 345 are pivotally received in the clasping holes 323, 324 of the clasping plates 321, 322 respectively. The expanding portion 344 axially defines a gap 346 through a middle thereof to provide radial resiliency to the expanding portion 344. The expanding portion 344 defines a groove 347 in a circumferential periphery thereof. The groove 347 is used for engagingly receiving the clasping plate 322 when the expanding portion 344 is received in the clasping hole 324. The expanding portion 344 at a place near the groove 347 has a diameter which is greater than a width of the clasping hole 324. In assembly of the clip 30, the expanding portion 344 is pressed into the clasping hole 324 until the clasping plate 322 snaps in the groove 347. The column portion 345 is received in clasping hole 323 whereby the operating member 34 is pivotally connected to the clipping member 32.

Figure 2:
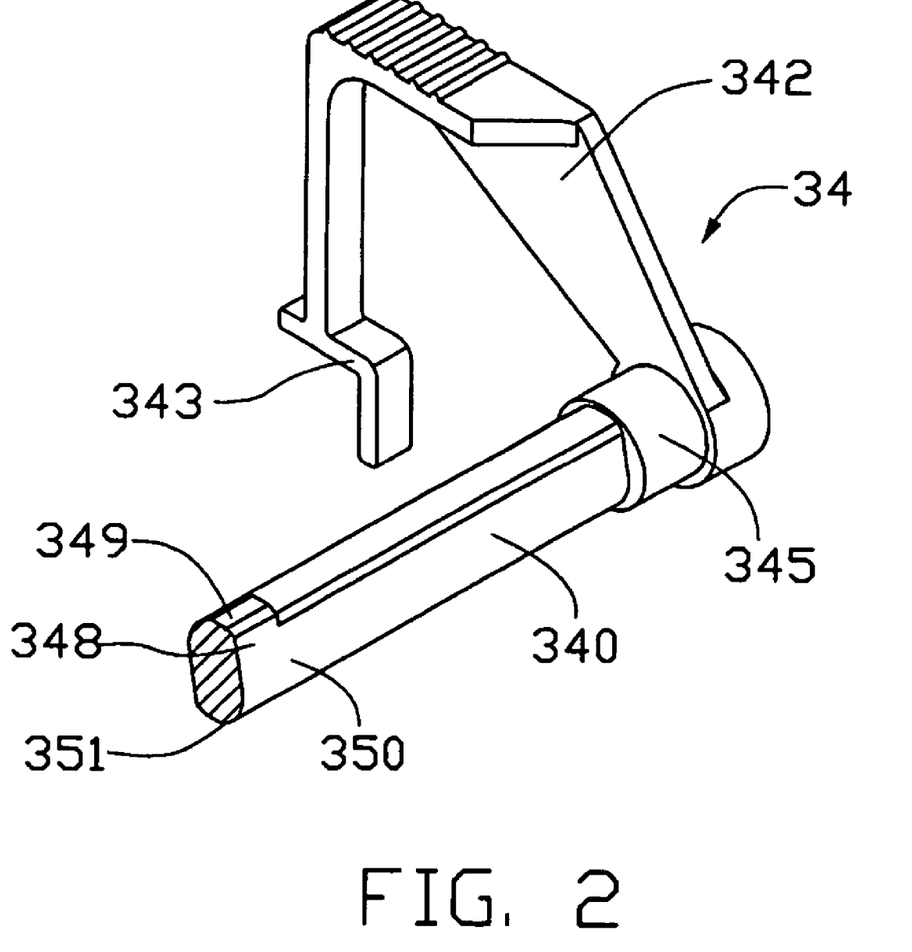
FIG. 2 is an isometric view of an operating member of the heat dissipating apparatus of FIG. 1 with a part thereof being cut away.

Also referring to FIG. 2, the pole 340 of the operating member 34 further includes a supporting portion 348 corresponding to the middle pressing surface 325 of the clipping member 32. The supporting portion 348 defines a first surface 349 and two second surfaces 350 beside the first surface 349. A distance between the first surface 349 and an opposite surface 351 is greater than a distance between the two second surfaces 350. The supporting portion 348 is rectangular shaped with rounded corners. By such design, the pole 340 can more easily rotate in the channel 140 of the heat sink 10.

Figure 3:
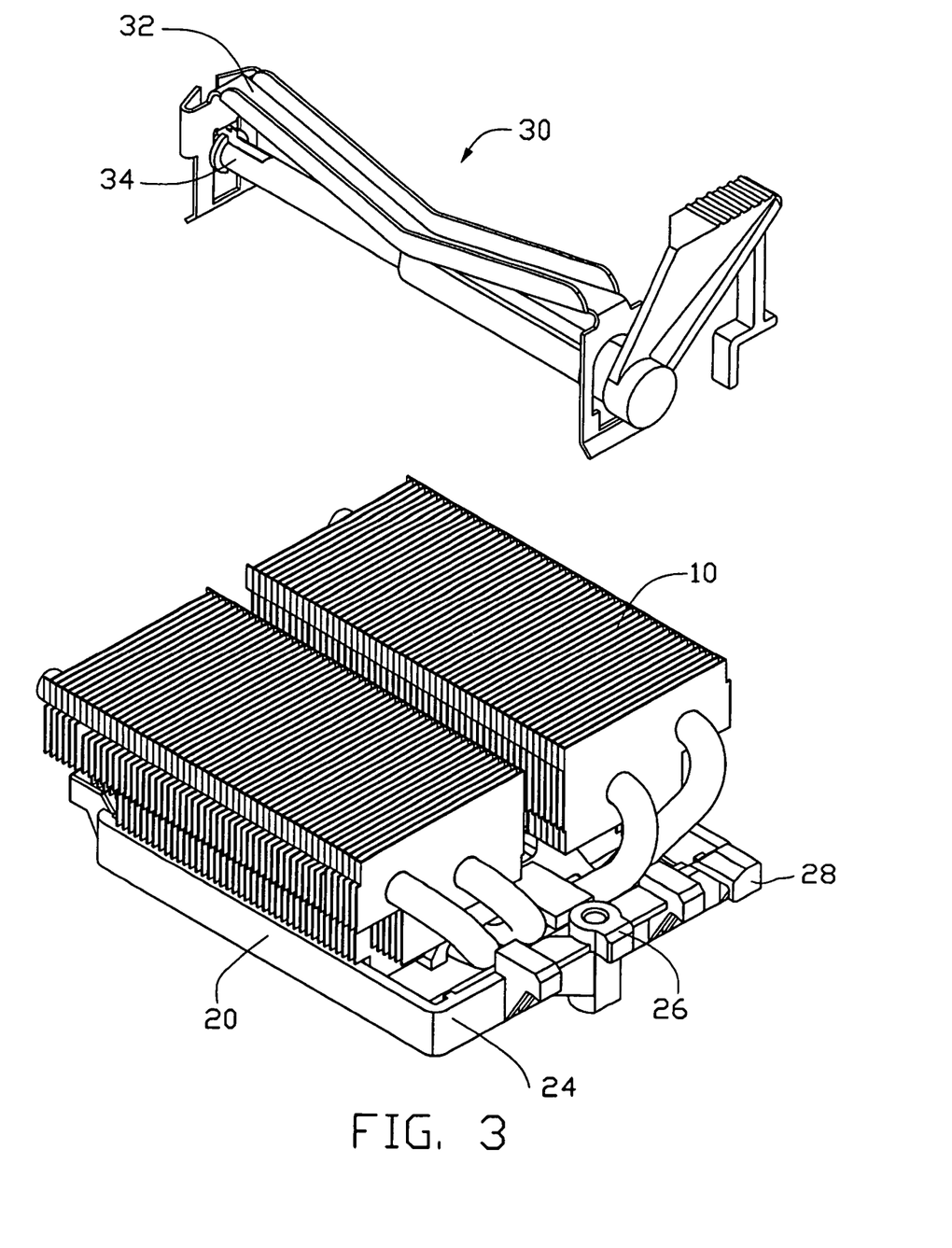
FIG. 3 is a partly assembled view of FIG. 1.
Figure 4:
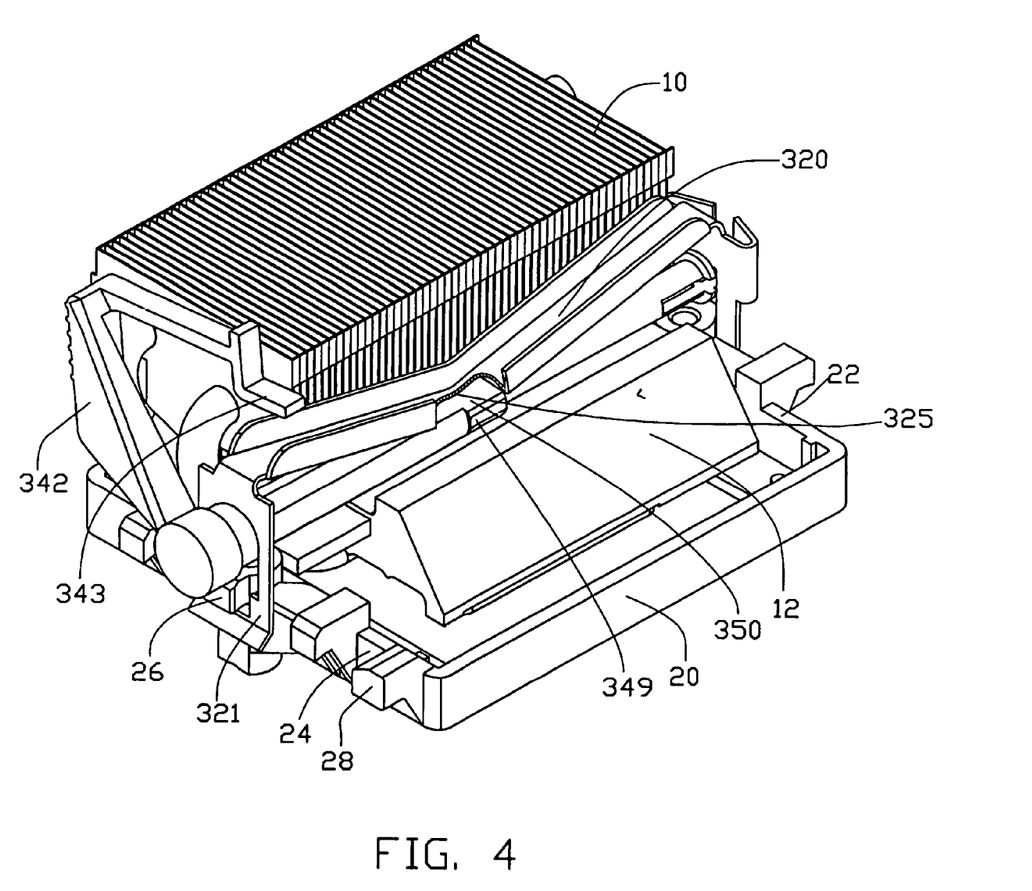
FIG. 4 to FIG. 7 are assembled views of FIG. 1, at different operating positions and with different parts being cut away.
Figure 5:
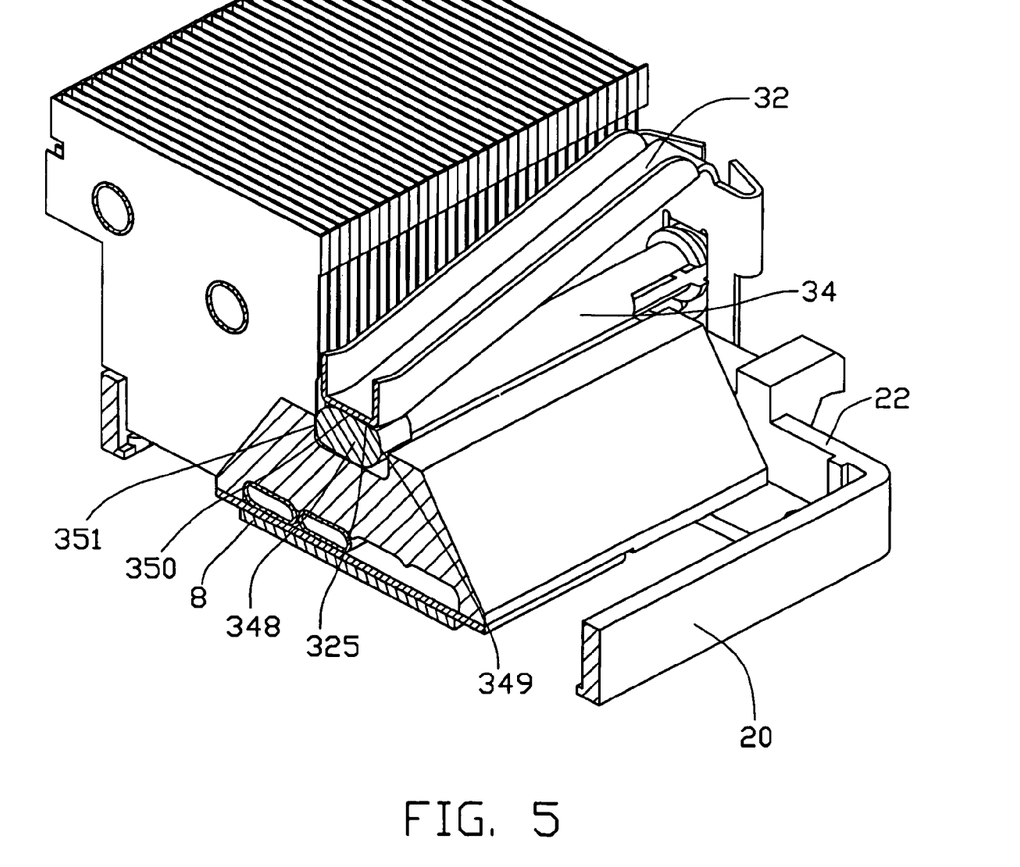

Referring to FIG. 3 to FIG. 5, in assembly of the heat dissipating device, the heat sink 10 and the clip 30 are respectively mounted to the retention module 20 and the channel 140, with the clipping portions 26 of the retention module 20 extending into the clasping holes 323, 324, respectively. Meanwhile, the two second surfaces 350 of the operating member 34 loosely contact with the pressing surface 325 of the clipping member 32 and a surface (not labeled) of the base 12 in the channel 14, respectively, with the clip 30 staying in an unlock position.

Figure 6:
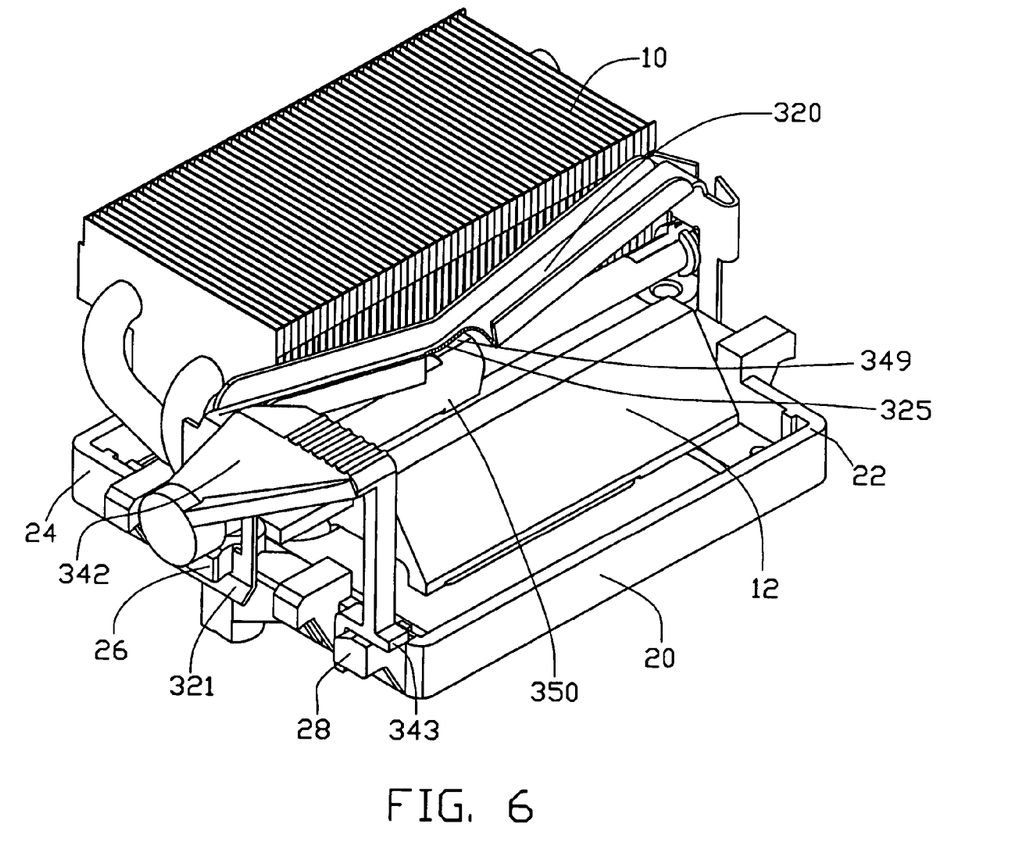
Figure 7:
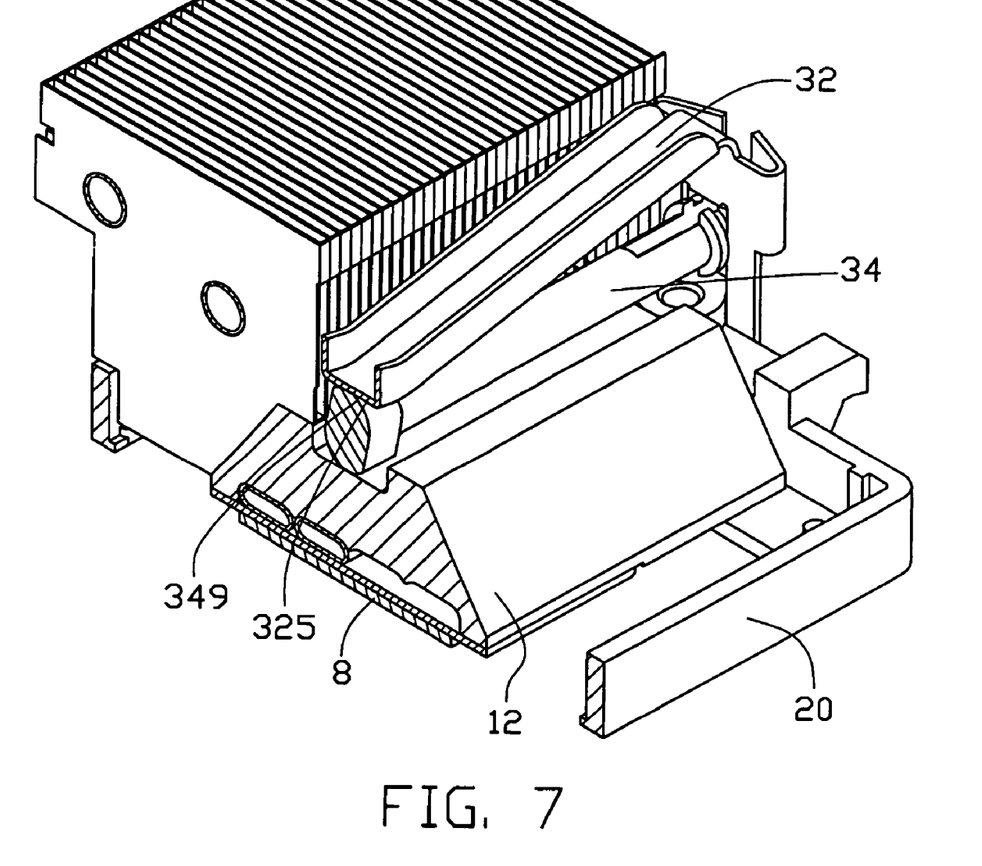
Figure 8:
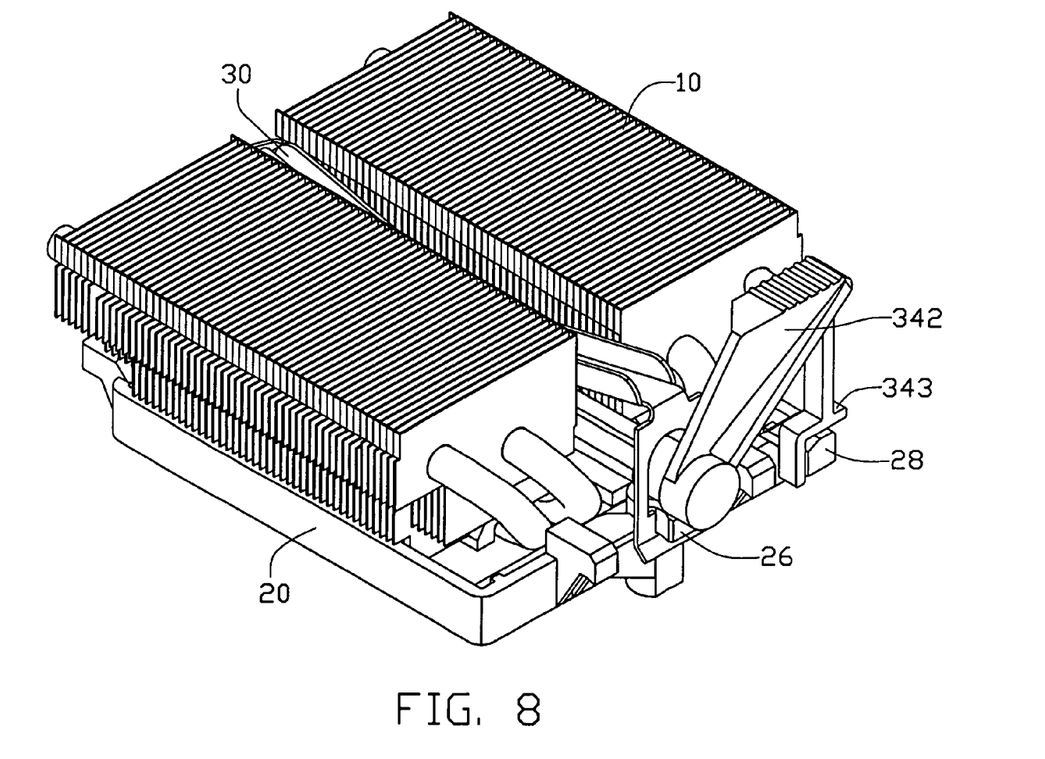
FIG. 8 is an assembled view of FIG. 1.

Referring to FIG. 6 to FIG. 8, the driving end 342 of the operating portion 341 is pressed to drive the operating member 34 to rotate relative to the clipping member 32 until the clip 30 reaches a lock position to mount the heat sink 10 on the retention module 20 and downwardly press the heat sink 10 against the heat generating component 8 so that the heat generating component 8 intimately engages with the heat sink 10. In the lock position, the first and opposite surfaces 349, 351 of the supporting portion 348 respectively abut against the pressing surface 325 and the surface of the base 12 in the channel 140. The blocking portion 28 of the retention module 20 engages the pressing end 343 of the operating portion 341, preventing the pressing end 343 from rotating downwardly. In this process, the supporting portion 348 drives the clipping member 32 to move upwardly to reach a position in which the clasping plates 322, 324 securely engage with the clipping portions 26, respectively. So the clipping member 32 forms a resilient distortion downwardly, and presses the heat sink 10 toward the retention module 20.

In the present invention, the heat sink 10 can be mounted to the retention module 20 just by the rotation of the operating member 34. This makes the heat dissipating apparatus can be simply assembled. The operating member 34 which extends perpendicularly from the longitudinal pole 340 for rotating the pole 340 to moves from the unlock to the lock position of the clip 30 is located outside the heat sink 10; thus, the operation of the clip 30 does not need to occupy a large space of the heat sink 10. The only space the operation of the clip 30 needs to occupy from the heat sink 10 is the channel 140 which is relative small since the pole 340 does not have any significant radial projection thereon and the main body 320 of the clipping member 32 is an elongated plate having a relatively small width.

In the present invention, the cross section of the supporting portion 348 may have other shape such as, ellipse or cam. The only requirement is that the supporting portion 348 can push upwardly the clipping member 32 a sufficient distance so that the clasping plates 321, 322 can have secure engagement with the clipping portions 26 of the retention module 20, when the operating member 34 is rotated to the lock position of the clip 30.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipating apparatus comprising:
a retention module forming clipping portions thereon;
a heat sink mounted to the retention module; and
a clip comprising:
a resilient clipping member clasped with the clipping portions; and
an operating member pivotally mounted to the clipping member, and comprising a longitudinal pole rotating about an axial direction thereof, the longitudinal pole forming a supporting portion which, when the operating member is rotated to a lock position, push downwardly the heat sink and push upwardly the clipping member to cause the clipping member to have a secure engagement with the clipping portions;
wherein the operating member is pivotally mounted to two ends of the clipping member.

2. The heat dissipating apparatus as described in claim 1, wherein the heat sink forms a channel in a middle portion thereof for receiving, the clip being received in the channel.

3. The heat dissipating apparatus as described in claim 1, wherein the clipping member comprises a middle pressing surface contacted with the supporting portion.

4. The heat dissipating apparatus as described in claim 1, wherein the clipping member defines two clasping holes at the two ends thereof to receive the pole and the clipping portions of the retention module.

5. The heat dissipating apparatus as described in claim 4, wherein the pole includes an expanding portion at one end thereof, the expanding portion axially defines a gap through a middle of the expanding portion to provide radial resiliency for the expanding portion, the expanding portion being received in one of the two clasping holes.

6. The heat dissipating apparatus as described in claim 5, wherein the expanding portion defines a groove in a circumferential periphery thereof, the groove engagingly receiving one of the two ends of the clipping member.

7. The heat dissipating apparatus as described in claim 6, wherein the expanding member at a place near the groove having a diameter larger than a width of the one of the two clasping holes receiving the expanding portion.

8. The heat dissipating apparatus as described in claim 1, wherein the operating member includes an operating portion integrally formed with the pole, the operating portion is located outside the heat sink.

9. The heat dissipating apparatus as described in claim 1, wherein the retention module forms a blocking portion thereon, and the operating portion includes a pressing end engaging with the blocking portion when the operating member is rotated to the lock position.

10. A heat dissipating apparatus comprising:
a heat sink contacted with a heat generating component;
a clipping member for mounting the heat sink on the heat generating component;
an operating member pivotally mounted to the clipping member, at least one portion of the operating member mounted between the heat sink and the clipping member, the at least one portion can move from an unlock position to a lock position to support the clipping member away from the heat generating component; and
a retention module mounted between the heat generating component and the clipping member;
wherein the retention module comprises clipping portions thereon, and the clipping member defines two clasping holes at two ends thereof for receiving the clipping portions respectively.

11. The heat dissipating apparatus as described in claim 10, wherein the at least one portion defines a first surface to support the clipping member at the lock position, and a second surface to contact with the clipping member at the unlock position.

12. An electronic combination, comprising:
a heat-generating electronic device;
a retention module surrounding the electronic device;
a heat sink mounted on the retention module, having a base thermally contacting with the electronic device and fins projecting upwardly from the base; and
a clip having a clipping member and an operating member, the operating member having an longitudinal pole located in the fins of the heat sink and rotatably connected to the clipping member and an operating portion projecting from the longitudinal pole and located outside the fins of the heat sink, the operating member being rotatable between unlock and lock positions, at the lock position the longitudinal pole activating the clipping member to move upwardly and have a secure engagement with the retention module and activating the heat sink to move downwardly to have an intimate contact with the electronic device;
wherein the clipping member has an elongate main body and two clasping plates downwardly extending from two ends of the main body, respectively, the longitudinal pole rotatably engaging at least one of the two clasping plates, and at the lock position, the clasping plates securely engaging with the retention module.

13. The electronic combination in accordance with claim 12, wherein the main body of the clipping member is bent downwardly at a middle portion thereof, and at the lock position, the pole of the operating member pushing upwardly the middle portion of the main body of the clipping member.

14. The electronic combination in accordance with claim 13, wherein the pole of the operating member has an end remote from the operating portion, the end has resiliency in radial direction, the end rotatably engaging the at least one of the two clasping plates.

15. The electronic combination in accordance with claim 14, wherein a portion of the pole pushing upwardly the clipping member at the lock position has a rectangular cross section with rounded corners.

* * * * *